(12) United States Patent
Kudou

(10) Patent No.: US 10,439,027 B2
(45) Date of Patent: Oct. 8, 2019

(54) SILICON CARBIDE SEMICONDUCTOR DEVICE AND METHOD FOR MANUFACTURING THE SAME

(71) Applicant: Panasonic Intellectual Property Management Co., Ltd., Osaka (JP)

(72) Inventor: Chiaki Kudou, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/048,488

(22) Filed: Jul. 30, 2018

(65) Prior Publication Data

US 2019/0067424 A1    Feb. 28, 2019

(30) Foreign Application Priority Data

Aug. 29, 2017   (JP) .................. 2017-164352

(51) Int. Cl.
*H01L 29/16* (2006.01)
*H01L 29/423* (2006.01)
(Continued)

(52) U.S. Cl.
CPC .... *H01L 29/1608* (2013.01); *H01L 21/02529* (2013.01); *H01L 21/049* (2013.01);
(Continued)

(58) Field of Classification Search
CPC .............. H01L 21/0485; H01L 29/1608; H01L 29/41741; H01L 29/4232; H01L 29/45;
(Continued)

(56) References Cited

U.S. PATENT DOCUMENTS

2008/0227256 A1  9/2008  Tanimoto
2010/0075474 A1* 3/2010  Kudou .............. H01L 29/66068
                                                              438/197
(Continued)

FOREIGN PATENT DOCUMENTS

JP    2008-235331    10/2008
JP    2014-216444    11/2014

*Primary Examiner* — Zandra V Smith
*Assistant Examiner* — Molly K Reida
(74) *Attorney, Agent, or Firm* — McDermott Will & Emery LLP

(57) ABSTRACT

Provided is a silicon carbide semiconductor device that is further reduced in resistance. Silicon carbide semiconductor device includes silicon carbide semiconductor layer disposed on a first main surface of substrate, electrode layer containing polysilicon disposed on the silicon carbide semiconductor layer with first insulating layer interposed between the electrode layer and the silicon carbide semiconductor layer, second insulating layer that covers the silicon carbide semiconductor layer and the electrode layer, first silicide electrode that is located in first opening part formed in the first insulating layer and the second insulating layer and forms ohmic contact with a part of the silicon carbide semiconductor layer, and second silicide electrode that is located in second opening part formed in the second insulating layer and is in contact with a part of the electrode layer.

19 Claims, 14 Drawing Sheets

(51) Int. Cl.
    *H01L 29/10*     (2006.01)
    *H01L 29/08*     (2006.01)
    *H01L 21/28*     (2006.01)
    *H01L 29/78*     (2006.01)
    *H01L 29/417*     (2006.01)
    *H01L 29/45*     (2006.01)
    *H01L 29/66*     (2006.01)
    *H01L 23/532*     (2006.01)
    *H01L 21/02*     (2006.01)
    *H01L 21/3105*     (2006.01)
    *H01L 21/768*     (2006.01)
    *H01L 21/04*     (2006.01)

(52) U.S. Cl.
    CPC .... *H01L 21/0485* (2013.01); *H01L 21/28052* (2013.01); *H01L 21/31056* (2013.01); *H01L 21/76828* (2013.01); *H01L 23/5329* (2013.01); *H01L 29/0856* (2013.01); *H01L 29/1095* (2013.01); *H01L 29/41741* (2013.01); *H01L 29/4232* (2013.01); *H01L 29/45* (2013.01); *H01L 29/66068* (2013.01); *H01L 29/7802* (2013.01)

(58) Field of Classification Search
    CPC ......... H01L 29/66068; H01L 29/66053; H01L 29/7802–7815
    See application file for complete search history.

(56) References Cited

U.S. PATENT DOCUMENTS

2010/0163888 A1*   7/2010   Saggio ................ H01L 29/0619
                                                                                             257/76
2010/0207125 A1*   8/2010   Uchida ............... H01L 21/0485
                                                                                             257/77
2010/0276703 A1    11/2010   Tanimoto

* cited by examiner

SILICON CARBIDE SEMICONDUCTOR DEVICE AND METHOD FOR MANUFACTURING THE SAME

BACKGROUND

1. Technical Field

The present disclosure relates to a silicon carbide semiconductor device and a method for manufacturing the semiconductor device.

2. Description of the Related Art

A power semiconductor device is a semiconductor element used to cause a high current to flow with a high breakdown voltage, and is required to have a low loss. Conventionally, power semiconductor devices using a silicon (Si) substrate have been dominant. In recent years, however, power semiconductor devices using a silicon carbide (SiC) substrate have received attention and have been developed.

Silicon carbide (SiC) has a dielectric breakdown voltage one digit higher than that of silicon (Si), and thus is capable of maintaining a breakdown voltage even with a thin depletion layer at a pn junction or a Schottky contact. Using silicon carbide with such a feature enables a device to be reduced in thickness and to be doped at higher concentration. Accordingly, silicon carbide is expected to be used as a material for forming a power semiconductor device having a low on-resistance, a high breakdown voltage, and a low loss.

One of typical semiconductor elements made of SiC is metal-insulator-semiconductor field-effect transistors (MISFETs). A metal-oxide-semiconductor field-effect transistor (MOSFET) is one kind of MISFETs.

Patent Literatures 1 and 2 disclose a vertical MISFET using SiC and a process for manufacturing the same.

CITATION LIST

Patent Literature

PTL 1: Unexamined Japanese Patent Publication No. 2008-235331
PTL 2: Unexamined Japanese Patent Publication No. 2014-216444

SUMMARY

A silicon carbide semiconductor device such as an MISFET is required to be further reduced in resistance (loss). Furthermore, a silicon carbide semiconductor device such as an MISFET is required to be further reduced in manufacturing cost from the perspective of mass production.

An aspect of the present disclosure provides a silicon carbide semiconductor device that is further reduced in resistance. Furthermore, an aspect of the present disclosure provides a method for manufacturing such a silicon carbide semiconductor device at lower cost.

One aspect of the present disclosure includes a silicon carbide semiconductor device described below. That is, the silicon carbide semiconductor device includes a substrate, a silicon carbide semiconductor layer, a first insulating layer, an electrode layer, a second insulating layer, a first silicide electrode, and a second silicide electrode. The substrate has a first main surface. The silicon carbide semiconductor layer is disposed on the first main surface of the substrate. The electrode layer contains polysilicon. The electrode layer is disposed on the silicon carbide semiconductor layer with the first insulating layer interposed between the electrode layer and silicon carbide semiconductor layer. The second insulating layer covers the silicon carbide semiconductor layer and the electrode layer. The first silicide electrode is located in a first opening part formed in the first insulating layer and the second insulating layer. The first silicide electrode forms ohmic contact with a part of the silicon carbide semiconductor layer. The second silicide electrode is located in a second opening part formed in the second insulating layer. The second silicide electrode is in contact with a part of the electrode layer. The first silicide electrode and the second silicide electrode each contain a silicide of a first metal element. An end of the second silicide electrode is located below the second insulating layer in a part surrounding the second opening part. A width of the second silicide electrode is larger than a width of a bottom surface of the second opening part in a cross section perpendicular to the first main surface of the substrate.

Another aspect of the present disclosure includes a method for manufacturing a silicon carbide semiconductor device including the following steps. Specifically, the method includes a step of preparing a substrate on which a silicon carbide semiconductor layer is formed, a step of forming an electrode layer by forming a polysilicon film on the silicon carbide semiconductor layer with a first insulating layer interposed between the polysilicon film and the silicon carbide semiconductor layer and then patterning the polysilicon film, and a step of forming a second insulating layer that covers the first insulating layer and the electrode layer. Furthermore, the method includes a first etching step, a second etching step, a metal film forming step, and a silicidation step. The first etching step is a step of forming, in the second insulating layer and the first insulating layer, a first opening part through which a part of the silicon carbide semiconductor layer is exposed and forming, in the second insulating layer, a second opening part through which a part of the electrode layer is exposed. The second etching step is a step of forming an eaves part in the second insulating layer by removing a part of the electrode layer that is located below the second insulating layer in a part surrounding the second opening part. The metal film forming step is a step of forming a metal film containing a first metal element on the second insulating layer and in the first opening part and the second opening part. In the second opening part, the metal film is divided into a first part located on a bottom surface of the second opening part and a second part located on a side wall of the second opening part by the eaves part of the second insulating layer. The silicidation step is a step of forming a first silicide electrode containing a silicide of the first metal element by causing the metal film and the silicon carbide semiconductor layer to react with each other in the first opening part through thermal treatment of the substrate. Furthermore, in the silicidation step, a second silicide electrode containing a silicide of the first metal element is formed by causing the first part of the metal film and the electrode layer to react with each other in the second opening part.

According to the silicon carbide semiconductor device according to the present disclosure, it is possible to further reduce on-resistance and reduce power loss. Furthermore, according to the method for manufacturing a silicon carbide semiconductor device according to the present disclosure, it is possible to manufacture a silicon carbide semiconductor device having lower resistance at lower cost.

DETAILED DESCRIPTION

Figure 1:
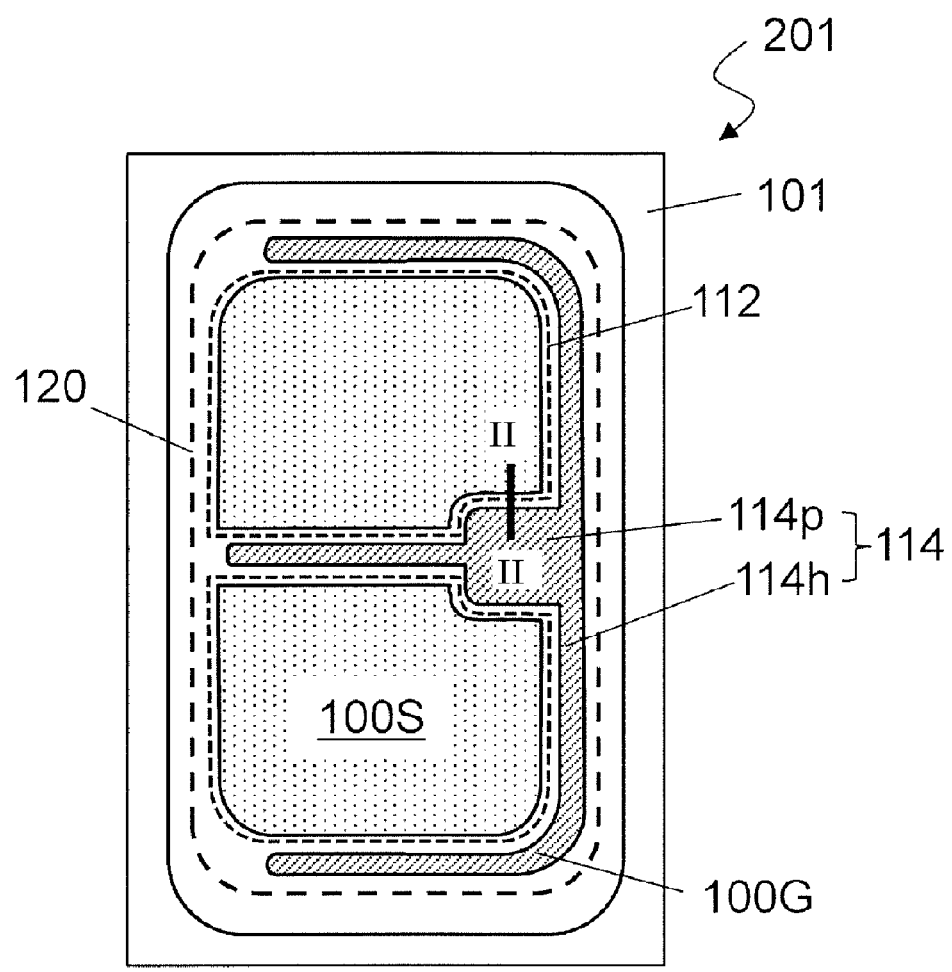
FIG. 1 is a top view illustrating a silicon carbide semiconductor device according to a first exemplary embodiment.

Underlying knowledge of the present exemplary embodiment is as follows.

A SiC-MISFET has a plurality of unit cells that are two-dimensionally aligned and are connected in parallel with one another. Each of the unit cells functions as a transistor (MISFET). An upper source electrode and an upper gate electrode are provided above the plurality of unit cells with an interlayer insulating layer interposed between the upper source electrode and the upper gate electrode and the plurality of unit cells. The upper source electrode is electrically connected to a source region and a body region that are SiC regions of each unit cell in a contact hole (source contact hole) formed in the interlayer insulating layer. The upper gate electrode is electrically connected to a gate electrode of each unit cell in a contact hole (gate contact hole) formed in the interlayer insulating layer. The gate electrode is, for example, a polysilicon layer. Hereinafter, a connection part between the SiC regions of each unit and the upper source electrode is referred to as a "source contact part", and a connection part between the gate electrode of each unit cell and the upper gate electrode is referred to as a "gate contact part".

A source contact part is typically formed as follows. First, a metal film such as a Ni film is formed on a SiC region. Next, thermal treatment is performed at a temperature of approximately 950° C. This forms a source electrode made of a metal silicide such as a Ni silicide on the SiC region (silicidation). The source electrode forms ohmic contact with the SiC region. Next, an upper source electrode (e.g., an Al electrode) is formed on the source electrode.

It is difficult to apply the silicidation process to a gate contact part. In a case where a metal film such as a Ni film is formed on a polysilicon layer that is a gate electrode and thermal treatment is performed, for example, at 950° C., there is a risk of abnormal growth of a metal silicide since polysilicon more easily reacts with a metal than SiC (see FIG. 10). Typically, in a case where a metal silicide is formed on a polysilicon layer, a temperature of thermal treatment is set, for example, to 750° C. or lower.

For this reason, conventionally, a source contact part and a gate contact part are formed in separate processes. For example, in the method disclosed in Patent Literature 2, a source contact hole for exposure of a SiC region is formed in an interlayer insulating layer in a region where a source contact part is to be formed. Next, a metal film is formed in the source contact hole, and a metal silicide is formed by thermal treatment (silicidation process). In this process, silicidation reaction does not occur between a polysilicon layer and the metal film since the polysilicon layer that is a gate electrode is protected by the interlayer insulating layer. Then, a gate contact hole for exposure of a part of the polysilicon layer is formed in the interlayer insulating layer in a region where a gate contact part is to be formed. Next, an upper source electrode that is in contact with the metal silicide in the source contact hole and an upper gate electrode that is in contact with the polysilicon layer in the gate contact hole are formed by using a common conductive film.

In a conventional method such as the method disclosed in Patent Literature 2, a source contact hole and a gate contact hole need be formed in separate etching processes. This increases a number of photomasks to be used and a number of photolithography processes and therefore sometimes causes an increase in manufacturing cost.

Furthermore, according to study of the inventor of the present invention, it is sometimes difficult to further reduce contact resistance in a gate contact part in a conventional SiC-MISFET such as the one disclosed in Patent Literature 2. Furthermore, a metal diffused from an upper gate electrode sometimes intrudes into a polysilicon layer and into an insulating layer below the polysilicon layer, thereby lowering reliability.

Based on such findings, the inventor of the present invention found that contact resistance can be further reduced and diffusion of a metal from an upper gate electrode into a polysilicon layer and the like can be suppressed by also disposing a metal silicide in a gate contact part. Furthermore, the inventor of the present invention found a method for manufacturing a silicon carbide semiconductor device having such a configuration at lower cost while suppressing abnormal growth of a metal silicide obtained by reaction between polysilicon and a metal film.

The outline of the silicon carbide semiconductor device of the present disclosure is as follows.

A silicon carbide semiconductor device according to one aspect of the present disclosure includes the following configuration. That is, the silicon carbide semiconductor device includes a substrate, a silicon carbide semiconductor layer, a first insulating layer, an electrode layer, a second insulating layer, a first silicide electrode, and a second silicide electrode. The substrate has a first main surface. The silicon carbide semiconductor layer is disposed on the first main surface of the substrate. The electrode layer contains polysilicon. The electrode layer is disposed on the silicon carbide semiconductor layer with the first insulating layer interposed between the electrode layer and the silicon carbide semiconductor layer. The second insulating layer covers the silicon carbide semiconductor layer and the electrode layer. The first silicide electrode is located in a first opening part formed in the first insulating layer and the second insulating layer. The first silicide electrode forms ohmic contact with a part of the silicon carbide semiconductor layer. The second silicide electrode is located in a second opening part formed in the second insulating layer. The second silicide electrode is in contact with a part of the electrode layer. The first silicide electrode and the second silicide electrode each contain a silicide of a first metal element. An end of the second silicide electrode is located below the second insulating layer in a part surrounding the second opening part. A width of the second silicide electrode is larger than a width of a bottom surface of the second opening part in the cross section perpendicular to the first main surface of the substrate.

The second silicide electrode may, for example, cover an entire bottom surface of the second opening part.

The second silicide electrode may be, for example, disposed only in the second opening part and a part surrounding the second opening part.

A lower surface of the second silicide electrode may be, for example, in contact with the electrode layer.

Thickness t1 of a part of the electrode layer that is located between the second silicide electrode and the first insulating layer is equal to or larger than ⅓ of thickness t2 of another part of the electrode layer and less than the thickness of the other part of the electrode layer.

At least a part of the lower surface of the second silicide electrode may be, for example, in contact with the first insulating layer.

The second silicide electrode may be, for example, thicker than the first silicide electrode.

The first metal element may be, for example, Ni or Ti.

The silicon carbide semiconductor device may, for example, further include a first upper electrode and a second upper electrode. The first upper electrode is disposed on the second insulating layer and in the first opening part and is in contact with the first silicide electrode in the first opening part. The second upper electrode is disposed on the second insulating layer and in the second opening part and is in contact with the second silicide electrode in the second opening part.

The substrate has, for example, a cell region and a wiring region. The cell region is a region where the first upper electrode is disposed and includes a plurality of unit cells. The second upper electrode is disposed in the wiring region. Each of the plurality of unit cells includes, for example, a second conductivity type body region, a first conductivity type source region, and a gate electrode. The second conductivity type body region is selectively formed on a surface of the silicon carbide semiconductor layer. The first conductivity type source region is selectively formed in the body region. The gate electrode is disposed on the silicon carbide semiconductor layer with the first insulating layer interposed between the gate electrode and the silicon carbide semiconductor layer. The electrode layer includes a gate part and a gate connection part. The gate part is located in the cell region and includes a gate electrode of each of the plurality of unit cells. The gate connection part is located in the wiring region and is connected to the gate part. The first opening part is disposed in each of the plurality of unit cells. The first silicide electrode is electrically connected to the source region and the body region in the silicon carbide semiconductor layer in the first opening part. The second opening part may be disposed in the wiring region, and the second silicide electrode may be in contact with the gate connection part of the electrode layer in the second opening part.

A part of the first insulating layer that is located below the second silicide electrode may be, for example, thicker than a part of the first insulating layer that is located below the gate part of the electrode layer.

The silicon carbide semiconductor device may, for example, further include, below the second silicide electrode, another second conductivity type body region that is selectively disposed on the surface of the silicon carbide semiconductor layer.

A method for manufacturing a silicon carbide semiconductor device according to an aspect of the present disclosure includes the following steps. Specifically, the method includes a step of preparing a substrate on which a silicon carbide semiconductor layer is formed, a step of forming an electrode layer by forming a polysilicon film on the silicon carbide semiconductor layer with a first insulating layer interposed between the polysilicon film and the silicon carbide semiconductor layer and then patterning the polysilicon film, and a step of forming a second insulating layer that covers the first insulating layer and the electrode layer. Furthermore, the method includes a first etching step, a second etching step, a metal film forming step, and a silicidation step. The first etching step is a step of forming, in the second insulating layer and the first insulating layer, a first opening part through which a part of the silicon carbide semiconductor layer is exposed and forming, in the second insulating layer, a second opening part through which a part of the electrode layer is exposed. The second etching step is a step of forming an eaves part in the second insulating layer by removing a part of the electrode layer that is located below the second insulating layer in a part surrounding the second opening part. The metal film forming step is a step of forming a metal film containing a first metal element on the second insulating layer and in the first opening part and the second opening part. In the second opening part, the metal film is divided into a first part located on a bottom surface of the second opening part and a second part located on a side wall of the second opening part by the eaves part of the second insulating layer. The silicidation step is a step of forming a first silicide electrode containing a silicide of the first metal element by causing the metal film and the silicon carbide semiconductor layer to react with each other in the first opening part through thermal treatment of the substrate. Furthermore, in the silicidation step, a second silicide electrode containing a silicide of the first metal element is formed by causing the first part of the metal film and the electrode layer to react with each other in the second opening part.

The first etching step may be, for example, a step of forming the first opening part and the second opening part by performing anisotropic etching of the second insulating layer and the first insulating layer by using a mask disposed on the second insulating layer. The second etching step may, for example, include a step of performing isotropic etching of a part of the electrode layer exposed in the second opening part.

The mask may be removed after the second etching step.

The mask may be removed between the first etching step and the second etching step.

Dry etching using first etching gas may be, for example, performed in the first etching step. Dry etching using second etching gas different from the first etching gas may be, for example, performed in the second etching step. The first etching step and the second etching step may be successively performed by switching etching gas in a chamber.

The thermal treatment in the silicidation step may be, for example, performed at a temperature ranging from 800° C. to 1050° C. inclusive.

The first metal element may be, for example, Ni or Ti.

First Exemplary Embodiment

A silicon carbide semiconductor device according to an exemplary embodiment of the present disclosure will now be described herein with reference to the accompanying drawings.

Figure 2:
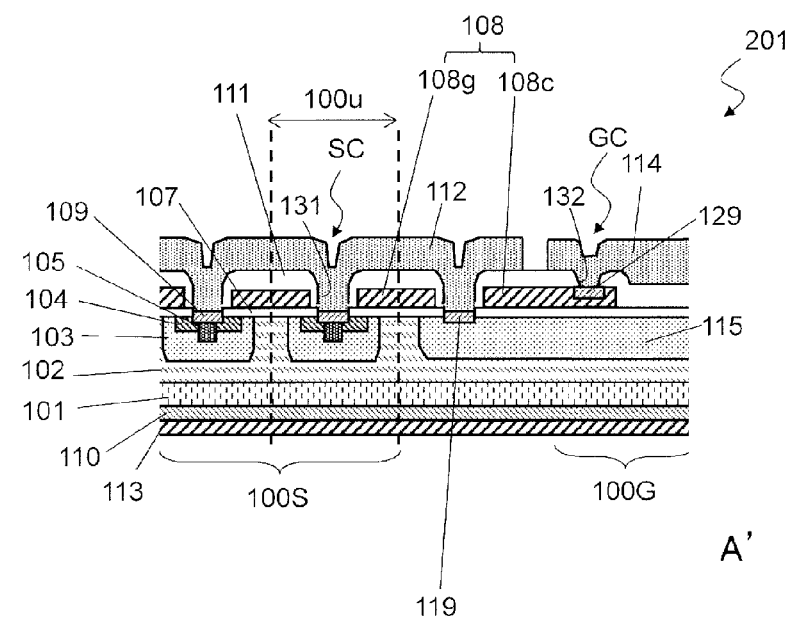
FIG. 2 is a cross-sectional view illustrating the silicon carbide semiconductor device according to the first exemplary embodiment.

FIG. 1 is a plan view illustrating an example of a silicon carbide semiconductor device according to the present exemplary embodiment, and FIG. 2 is a cross-sectional view illustrating an example of the silicon carbide semiconductor device taken along line II-II in FIG. 1.

Silicon carbide semiconductor device 201 includes substrate 101 and first conductivity type silicon carbide semiconductor layer (drift layer) 102 provided on a first main surface of substrate 101. Substrate 101 is, for example, first conductivity type silicon carbide substrate. Substrate 101 has a second main surface on which drain electrode 110 and wiring electrode 113 disposed on drain electrode 110 are provided. In the present exemplary embodiment, a first conductivity type is n-type, and a second conductivity type is p-type. Alternatively, the first conductivity type may be a p-type, and the second conductivity type may be an n-type.

Substrate 101 includes an active region and a termination region. In this example, a region surrounded by broken line 120 in FIG. 1 is the active region, and a region disposed so as to surround the active region is the termination region. The active region includes cell region 100S in which a plurality of unit cells 100u are arranged.

Furthermore, silicon carbide semiconductor device 201 includes electrode layer 108 that is provided above silicon carbide semiconductor layer 102 with insulating layer 107 interposed between electrode layer 108 and silicon carbide semiconductor layer 102 and interlayer insulating layer 111 that covers electrode layer 108. Electrode layer 108 includes gate electrode 108g of each unit cell 100u. Electrode layer 108 contains conductive polysilicon. Electrode layer 108 may be a single-layer film constituted by a polysilicon layer or may be a multilayer film including a polysilicon layer as an upper layer. Hereinafter, insulating layer 107 disposed between electrode layer 108 and silicon carbide semiconductor layer 102 is sometimes referred to as a "first insulating layer", and interlayer insulating layer 111 that covers electrode layer 108 is sometimes referred to as a "second insulating layer".

Upper source electrode 112 and upper gate electrode 114 (each of which is, for example, an Al electrode) are provided on interlayer insulating layer 111. Upper source electrode 112 and upper gate electrode 114 are electrically separated. As illustrated in FIG. 1, upper source electrode 112 is disposed in cell region 100S. Upper gate electrode 114 is disposed in region 100G other than the cell region. A part of upper gate electrode 114 may be located in the termination region. Hereinafter, region 100G in which upper gate electrode 114 is disposed is referred to as a "wiring region". Upper gate electrode 114 may include gate pad part 114p and gate upper wiring part 114h extending from gate pad part 114p. Gate pad part 114p may be disposed in the termination region. Gate upper wiring part 114h may extend so as to cross an outer periphery of the active region and/or the active region.

The plurality of unit cells 100u each function as an MISFET and are connected in parallel with one another. In other words, unit cells 100u constitute transistors, and thus silicon carbide semiconductor device 201 includes a plurality of transistors. When viewed from a direction perpendicular to the main surface of substrate 101, the plurality of unit cells 100u are arranged in a two-dimensional manner.

Each of unit cells 100u includes second conductivity type first body region 103 that is selectively formed on a surface of silicon carbide semiconductor layer 102, source region 104 that is selectively formed on a surface of first body region 103, and gate electrode 108g that is disposed above silicon carbide semiconductor layer 102 with insulating layer 107 interposed between gate electrode 108g and silicon carbide semiconductor layer 102. Gate electrode 108g is a part of electrode layer 108. A silicon carbide semiconductor epitaxial layer (not illustrated) may be provided as a channel layer between silicon carbide semiconductor layer 102 and insulating layer 107.

Source region 104 contains first conductivity type impurities with a concentration higher than that of the drift layer. For electrical connection to first body region 103, contact region 105 of the second conductivity type containing second conductivity type impurities at a higher concentration than first body region 103 is provided in source region 104 so as to be in contact with first body region 103 below source region 104. First body region 103, source region 104, and contact region 105 are formed through, for example, a step of injecting impurities into silicon carbide semiconductor layer 102, and a high-temperature thermal treatment (activating annealing) step of activating the impurities injected into silicon carbide semiconductor layer 102. Contact region 105 may be omitted.

Insulating layer 107 is, for example, a thermal oxide film (SiO$_2$ film) formed by thermal oxidation of a surface of silicon carbide semiconductor layer 102 (a surface of a channel layer in a case where a channel layer is formed).

In this example, insulating layer 107 is provided so as to have a substantially same thickness throughout the active region and the termination region. A part of insulating layer 107 that is located between gate electrode 108g and silicon carbide semiconductor layer 102 functions as a gate insulating layer.

Electrode layer 108 extends from cell region 100S to wiring region 100G. Electrode layer 108 has a gate part located in cell region 100S and gate connection part 108c located in wiring region 100G. The gate part includes gate electrode 108g of each unit cell 100u. Gate electrodes 108g of adjacent unit cells 100u may be connected to each other. For example, the gate part of electrode layer 108 may have a net-shaped structure having a plurality of openings for formation of source contact parts Sc of the respective unit cells. Gate connection part 108c is disposed in wiring region 100G above silicon carbide semiconductor layer 102 with insulating layer 107 interposed between gate connection part 108c and silicon carbide semiconductor layer 102. Gate connection part 108c extends from the gate part and is connected to the gate part. Electrode 108g and gate connection part 108c are electrically separated.

The termination region has a termination structure. Unit cell 100u operating as a transistor is not provided in the termination region. The termination structure is selectively formed on a surface of silicon carbide semiconductor layer 102 and has second conductivity type second body region 115 that surrounds the active region. Second body region 115 may be disposed below gate contact part GC in wiring region 100G. A second contact region (not illustrated) that contains second conductivity type impurities at a higher concentration than first body region 103 may be formed in second body region 115. Second body region 115 may have an impurity concentration profile identical to an impurity concentration profile of first body region 103 in a depth direction. Similarly, the second contact region may have an impurity concentration profile identical to an impurity concentration profile of contact region 105 in the depth direction. In other words, second body region 115 may be formed in a step identical to a step of forming first body region 103, and the second contact region may be formed in a step identical to a step of forming contact region 105.

Silicon carbide semiconductor device 201 includes a plurality of source contact parts SC that connect upper source electrode 112 and a part of silicon carbide semiconductor layer 102 and at least one gate contact part GC that connect upper gate electrode 114 and a part of electrode layer 108.

Each of source contact parts SC is disposed, for example, in a corresponding unit cell in cell region 100S. Each of source contact parts SC has, in interlayer insulating layer 111 and insulating layer 107, first opening part (also referred to as a source contact hole) 131 formed so as to expose a part of silicon carbide semiconductor layer 102. First silicide electrode (also referred to as a source electrode) 109 that is in contact with a SiC region that is a part of silicon carbide semiconductor layer 102 is disposed in first opening part 131. First silicide electrode 109 forms ohmic contact with the SiC region. Each first silicide electrode 109 is, for example, electrically connected to source region 104 and first body region 103 of corresponding unit cell 100u. In this example, first silicide electrode 109 is in contact with source region 104 and contact region 105 in first opening part 131. First body region 103 is electrically connected to first silicide electrode 109 via contact region 105.

In each of source contact parts SC, upper source electrode 112 is in contact with first silicide electrode 109 in first opening part 131. Upper source electrode 112 is electrically connected to source region 104 and contact region 105 of corresponding unit cell 100u via first silicide electrode 109. That is, first silicide electrode 109 of each unit cell 100u is connected in parallel with upper source electrode 112.

Gate contact part GC is disposed in wiring region 100G. A plurality of gate contact parts GC may be disposed at intervals in wiring region 100G. Each of gate contact parts GC may have a rectangular shape or may have a linear shape extending along upper gate electrode 114. In gate contact part GC, second opening part (also referred to as a gate contact hole) 132 is formed in interlayer insulating layer 111 so as to expose gate connection part 108c that is a part of electrode layer 108. Second opening part 132 may be located above second body region 115. Second silicide electrode 129 that is in contact with a part of gate connection part 108c is disposed in second opening part 132.

In each of gate contact parts GC, upper gate electrode 114 is in contact with second silicide electrode 129 in second opening part 132. Upper gate electrode 114 is electrically connected to gate connection part 108c via second silicide electrode 129. This allows gate electrode 108g of each unit cell to be electrically connected to upper gate electrode 114.

First silicide electrode 109 and second silicide electrode 129 each contain a silicide of a first metal element. The first metal element is, for example, Ni or Ti. In the present exemplary embodiment, first silicide electrode 109 and second silicide electrode 129 can be formed in a common silicidation step as described later.

In the present exemplary embodiment, in gate contact part GC, second silicide electrode 129 that has lower electric resistance than polysilicon is disposed between upper gate electrode 114 and electrode layer 108. This can keep contact resistance lower than contact resistance in conventional arts, thereby improving an operation speed of silicon carbide semiconductor device 201. Furthermore, by disposing second silicide electrode 129 in gate contact part GC, it is possible to keep a metal (e.g., Al) of upper gate electrode 114 from diffusing to insulating layer 107 or silicon carbide semiconductor layer 102 through a polysilicon layer. It is therefore possible to improve reliability.

Figure 3:
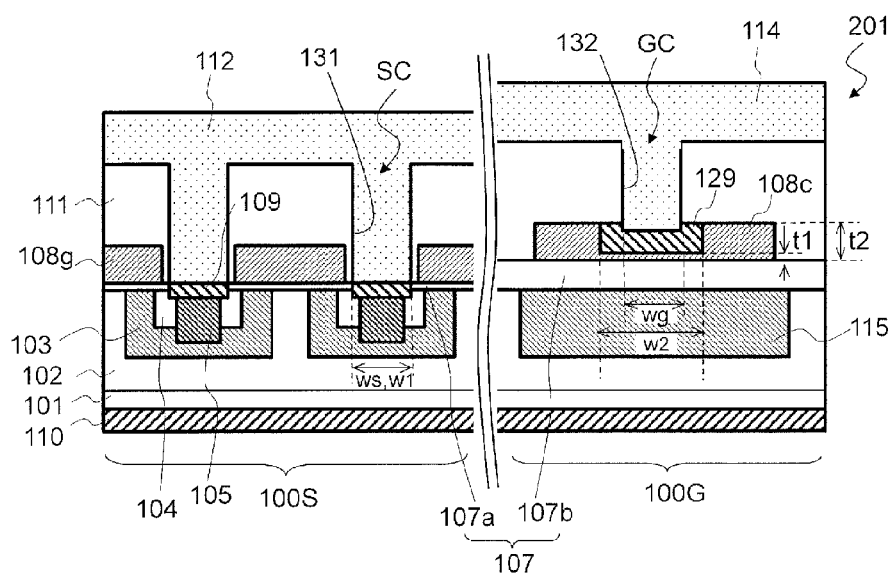
FIG. 3 is an enlarged cross-sectional view illustrating a source contact part and a gate contact part in the silicon carbide semiconductor device according to the first exemplary embodiment.

FIG. 3 is an enlarged cross-sectional view illustrating source contact part SC and gate contact part GC according to the present exemplary embodiment. In FIG. 3 and the subsequent drawings, constituent elements that are similar to the constituent elements in FIG. 2 are given identical reference signs. Furthermore, repeated description is omitted as appropriate.

As illustrated in FIG. 3, insulating layer 107 may include gate insulating layer 107a and field insulating layer 107b that is thicker than gate insulating layer 107a. Gate insulating layer 107a is disposed at least in cell region 100S. Field insulating layer 107b is, for example, disposed so as to surround the active region. A part of field insulating layer 107b is located below at least one of the plurality of gate contact parts GC. This allows a part of insulating layer 107 that is located below gate connection part 108c in gate contact part GC (i.e., a part of insulating layer 107 that is located below second silicide electrode 129) to be thicker than a part of insulating layer 107 that is located below gate electrode 108g. This makes it possible to more effectively keep a metal of upper gate electrode 114 or second silicide electrode 129 from diffusing to silicon carbide semiconductor layer 102, thereby further improving reliability.

In source contact part SC in each unit cell 100u, first silicide electrode 109 is disposed in first opening part 131 formed in interlayer insulating layer 111 and gate insulating layer 107a so as to be in contact with source region 104 and contact region 105. First silicide electrode 109 may cover an entire bottom surface of first opening part 131. In this example, first silicide electrode 109 is formed only on a part of silicon carbide semiconductor layer 102 that is exposed through first opening part 131. That is, width w1 of first silicide electrode 109 and width ws of first opening part 131 are substantially equal in a cross section perpendicular to the first main surface of substrate 101.

In gate contact part GC, second silicide electrode 129 is disposed in second opening part 132 formed in interlayer insulating layer 111 so as to be in contact with a part of gate connection part 108c. Second silicide electrode 129 may cover an entire bottom surface of second opening part 132. In this example, an end of second silicide electrode 129 is located below interlayer insulating layer 111 in a part surrounding second opening part 132. Width w2 of second silicide electrode 129 is larger than width wg of the bottom surface of second opening part 132 in the cross section perpendicular to the first main surface of substrate 101. For example, in a case where second opening part 132 is rectangular when viewed from a direction normal to the first main surface, second silicide electrode 129 may have a rectangular shape slightly larger than the bottom surface of second opening part 132. In a case where second opening part 132 has a linear shape, second silicide electrode 129 may have a linear shape wider than second opening part 132.

In this example, second silicide electrode 129 is disposed on a part of an upper surface of gate connection part 108c. A lower surface and a side surface of second silicide electrode 129 are in contact with gate connection part 108c. Since the part of gate connection part 108c is located between second silicide electrode 129 and insulating layer 107 (field insulating layer 107b in this example), it is possible to keep the first metal element (e.g., Ni) of second silicide electrode 129 from diffusing to insulating layer 107 or silicon carbide semiconductor layer 102. Thickness t1 of a part of gate connection part 108c that is located between second silicide electrode 129 and insulating layer 107 may be equal to or larger than ⅓ of thickness t2 of another part (a part of gate connection part 108c that is not located below second silicide electrode 129) and less than thickness t2.

Second silicide electrode 129 may be formed throughout a whole thickness of gate connection part 108c although this configuration is not illustrated. In this case, at least a part of a lower surface of second silicide electrode 129 is in contact with insulating layer 107. Even in a case where the whole lower surface of second silicide electrode 129 is in contact with insulating layer 107, a side surface of second silicide electrode 129 is in contact with gate connection part 108c, and therefore electrical connection can be secured.

Second silicide electrode 129 may be disposed only in second opening part 132 and a part surrounding second opening part 132. A metal silicide need not be formed on a part of the surface of electrode layer 108 that is sufficiently away from second opening part 132. For example, a metal silicide need not be formed on a surface of gate electrode 108g.

Although second conductivity type second body region 115 is disposed in silicon carbide semiconductor layer 102 below gate contact part GC in FIG. 3, a first conductivity type region may be disposed instead of second body region 115. For example, in a case where field insulating layer 107b is provided below gate contact part GC, an electric distance between gate connection part 108c and silicon carbide semiconductor layer 102 increases, and therefore it is unnecessary to form a second conductivity type region in silicon carbide semiconductor layer 102.

Method for Manufacturing Silicon Carbide Semiconductor Device 201

The following describes an example of a method for manufacturing silicon carbide semiconductor device 201 according to the present exemplary embodiment.

Figure 4A:
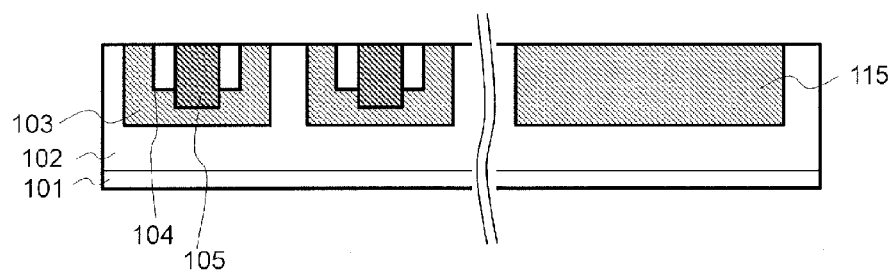
FIG. 4A is a step cross-sectional view illustrating a method for manufacturing the silicon carbide semiconductor device according to the first exemplary embodiment.

FIGS. 4A through 4I1 each are a step cross-sectional view for explaining a method for manufacturing silicon carbide semiconductor device 201 and illustrate a cross-sectional structure including source contact part SC and gate contact part GC.

First, as illustrated in FIG. 4A, silicon carbide semiconductor layer 102 is formed on substrate 101, and then first body region 103, second body region 115, source region 104, and contact region 105 are formed in silicon carbide semiconductor layer 102.

For example, a low-resistance n-type 4H-SiC off-cut substrate is used as substrate 101. Silicon carbide semiconductor layer 102 of n-type is formed on a main surface of substrate 101 by epitaxial growth. An impurity concentration and a thickness of silicon carbide semiconductor layer 102 may be, for example, $1\times10^{16}$ cm$^{-3}$ and 10 μm, respectively. First body region 103, second body region 115, source region 104, and contact region 105 are formed, for example, by a known ion implantation step. First body region 103 and second body region 115 may be formed by implanting second conductivity type impurity ions (e.g., Al ions) into silicon carbide semiconductor layer 102 by using a same implantation mask. First body region 103 is disposed in each unit cell in cell region 100S. A concentration and a depth of the second conductivity type impurities of first body region 103 and second body region 115 may be, for example, approximately $2\times10^{19}$ cm$^{-3}$ and approximately 0.5 μm to 1.0 μm, respectively. Source region 104 is formed, for example, by implanting nitrogen ions into silicon carbide semiconductor layer 102 as first conductivity type impurities. A concentration and a depth of the impurities of source region 104 may be, for example, approximately $5\times10^{19}$ cm$^{-3}$ and 250 nm, respectively. Contact region 105 is formed by implanting Al ions into silicon carbide semiconductor layer 102 as the first conductivity type impurities. A concentration and a depth of the impurities of contact region 105 may be, for example, approximately $1\times10^{20}$ cm and approximately 400 nm, respectively. A second contact region may be formed in second body region 115 in the same ion implantation step as contact region 105. After these ion implantation steps, high-temperature thermal treatment for activating the impurities implanted into silicon carbide semiconductor layer 102 is performed. The high-temperature thermal treatment is also called activation annealing. The high-temperature thermal treatment is performed, for example, at a temperature of approximately 1700° C. for approximately 30 minutes.

Then, a silicon carbide semiconductor epitaxial layer (not illustrated) may be formed as a channel layer on silicon carbide semiconductor layer 102.

Figure 4B:
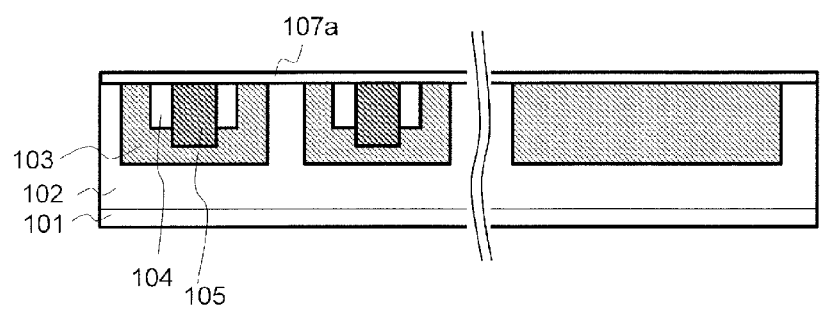
FIG. 4B is a step cross-sectional view illustrating a method for manufacturing the silicon carbide semiconductor device according to the first exemplary embodiment.

Next, as illustrated in FIG. 4B, gate insulating layer 107a is formed on silicon carbide semiconductor layer 102. Gate insulating layer 107a can be formed, for example, by performing a thermal oxidation step after removing a superficial part of silicon carbide semiconductor layer 102 (or the channel layer) by sacrificial oxidation. A thickness of gate insulating layer 107a may be in a range from 50 nm to 100 nm inclusive (e.g., 70 nm).

Figure 4C:
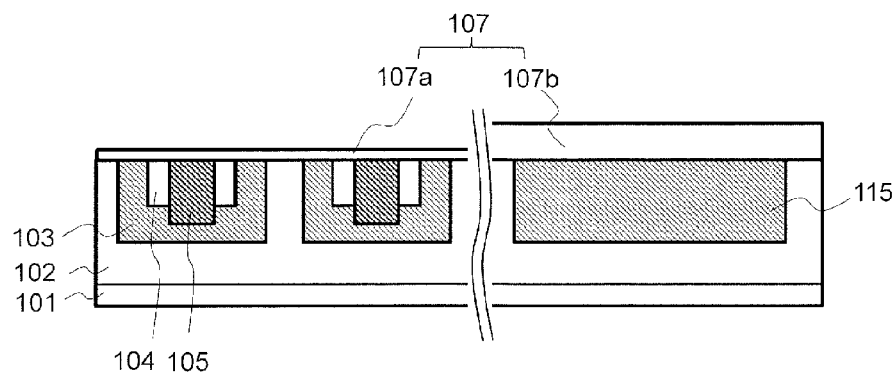
FIG. 4C is a step cross-sectional view illustrating a method for manufacturing the silicon carbide semiconductor device according to the first exemplary embodiment.

Next, as illustrated in FIG. 4C, field insulating layer 107b that is thicker than gate insulating layer 107a is formed on a part of the surface of silicon carbide semiconductor layer 102. In this example, field insulating layer 107b is also formed in a region (hereinafter referred to as a "gate contact formation region") in which a gate contact part is to be formed. Field insulating layer 107b can be formed, for example, by further depositing a $SiO_2$ layer on a part of gate insulating layer 107a. A thickness of field insulating layer 107b may be in a range from 100 nm to 1000 nm inclusive. In this way, insulating layer 107 including gate insulating layer 107a and field insulating layer 107b is formed on silicon carbide semiconductor layer 102. The step illustrated in FIG. 4C may be omitted. In this case, gate insulating layer 107a illustrated in FIG. 4B serves as insulating layer 107.

Figure 4D:
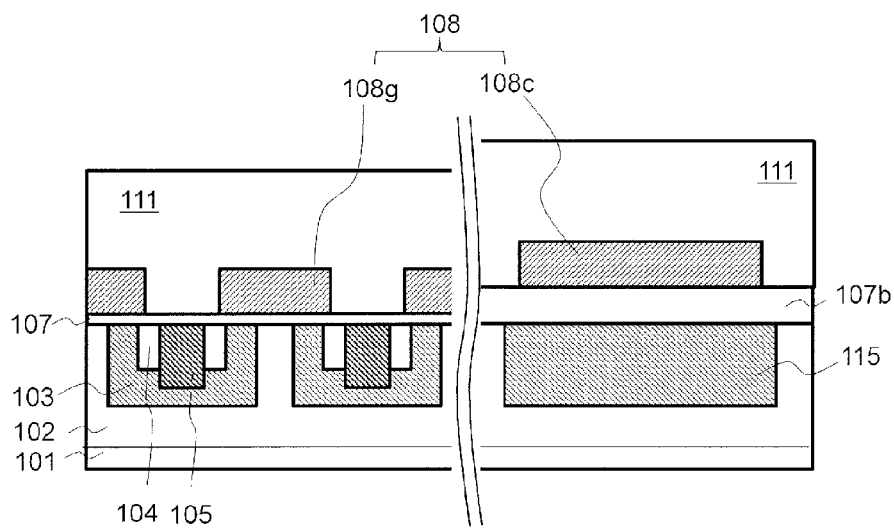
FIG. 4D is a step cross-sectional view illustrating a method for manufacturing the silicon carbide semiconductor device according to the first exemplary embodiment.

Then, as illustrated in FIG. 4D, electrode layer 108 and interlayer insulating layer 111 are formed. In this example, a polysilicon layer is formed as electrode layer 108.

Electrode layer 108 is formed by depositing, as a conductive film for gate electrode, a polysilicon film doped, for example, with approximately $7 \times 10^{20}$ $cm^{-3}$ of phosphorus on gate insulating layer 107a and field insulating layer 107b and then patterning the polysilicon film A thickness of the polysilicon film is, for example, in a range from 300 nm to 1000 nm inclusive (e.g., approximately 500 nm). Electrode layer 108 extends from cell region 100S to wiring region 100G. Electrode layer 108 includes a gate part that functions as gate electrode 108g of each unit cell and gate connection part 108c located in wiring region 100G. The gate part may have a net-shaped structure having a plurality of openings for formation of source contact parts SC. Gate electrodes 108g of adjacent unit cells 100u may be connected to each other.

Interlayer insulating layer 111 is formed so as to cover gate electrode 108g, gate connection part 108c, and insulating layer 107, for example, by a CVD method. Interlayer insulating layer 111 may be, for example, a $SiO_2$ layer. A thickness of interlayer insulating layer 111 is, for example, 1 μm.

Figure 4E:
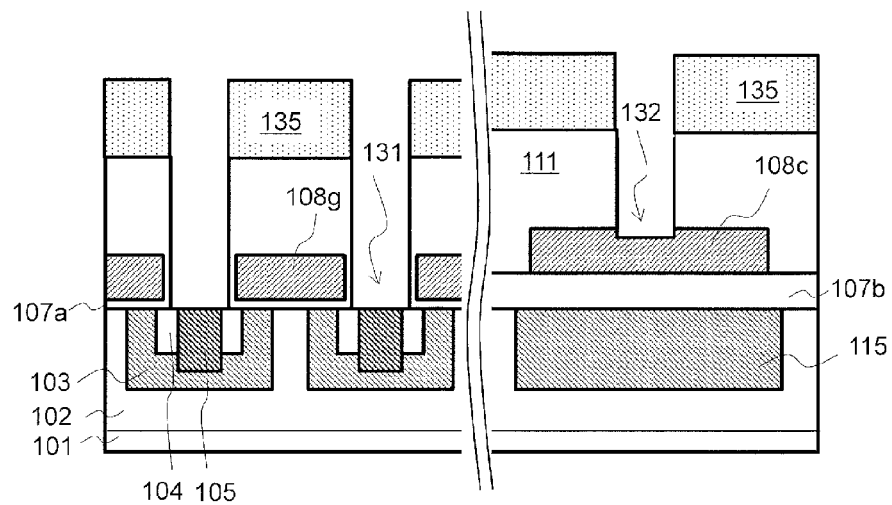
FIG. 4E is a step cross-sectional view illustrating a method for manufacturing the silicon carbide semiconductor device according to the first exemplary embodiment.

Then, as illustrated in FIG. 4E, mask 135 is formed on interlayer insulating layer 111 by using a resist film. Next, anisotropic etching of interlayer insulating layer 111 and gate insulating layer 107a is performed by using mask 135. In this example, dry etching is performed by using mixed gas containing C and H such as $CHF_3$ as etching gas (reactive gas). In this way, a part of interlayer insulating layer 111 and gate insulating layer 107a that is exposed through an opening part of mask 135 is etched mainly in a vertical direction. In this way, first opening part 131 through which at least a part of source region 104 and at least a part of contact region 105 are exposed is formed in each unit cell 100u. Meanwhile, in the gate contact part formation region, second opening part 132 through which a part of a surface of gate connection part 108c is exposed is formed in interlayer insulating layer 111. A superficial part of gate connection part 108c is sometimes removed in second opening part 132 (overetching).

Figure 4F:
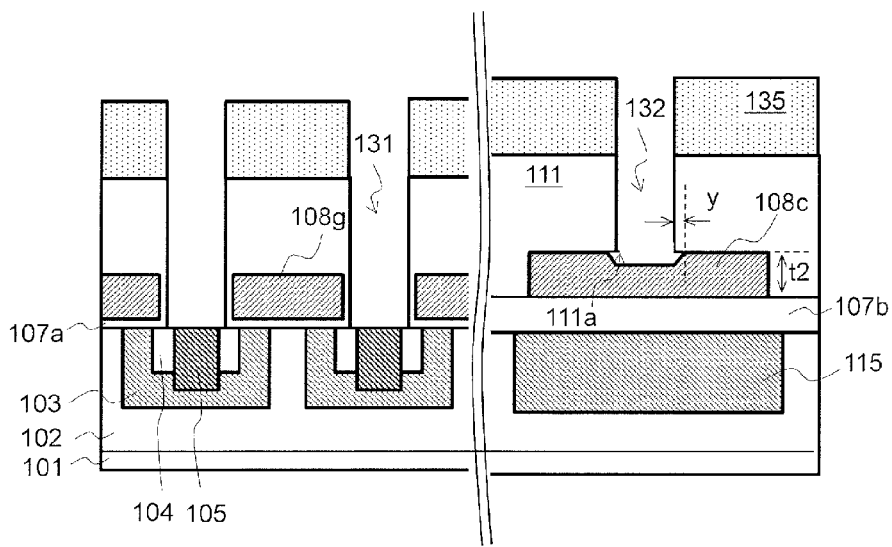
FIG. 4F is a step cross-sectional view illustrating a method for manufacturing the silicon carbide semiconductor device according to the first exemplary embodiment.

Then, as illustrated in FIG. 4F, isotropic etching of gate connection part 108c is performed. In this example, dry etching is performed by using mixed gas containing C, F, and O such as mixed gas containing $CF_4$ and $O_2$ as etching gas. This etches a superficial part of gate connection part 108c not only in a vertical direction but also in a lateral direction (a direction parallel with the first main surface of substrate 101). As a result, a part of gate connection part 108c that is located below interlayer insulating layer 111 is also etched, and eaves part 111a is formed in interlayer insulating layer 111 close to a peripheral part of second opening part 132 accordingly.

Width y (i.e., a distance over which gate connection part 108c is etched in the lateral direction) of eaves part 111a is not limited in particular. Width y of eaves part 111a may be, for example, ⅚ or more of a thickness of a metal film that will be formed later. Accordingly, step disconnection of the metal film can be caused by eaves part 111a with more certainty. However, in a case where width y of eaves part 111a is too large, gate connection part 108c becomes thin in second opening part 132, and an amount of polysilicon that reacts with the metal film decreases accordingly. For this reason, width y of eaves part 111a may be, for example, ⅕ or less of thickness t2 of gate connection part 108c.

Hereinafter, a step of performing anisotropic etching of interlayer insulating layer 111 illustrated in FIG. 4E is referred to as a "first etching step", and a step of performing isotropic etching of gate connection part 108c illustrated in FIG. 4F is referred to as a "second etching step". Etching gas used in the first etching step and etching gas used in the second etching step are referred to as "first etching gas" and "second etching gas", respectively.

The first etching step and the second etching step may be successively performed by switching etching gas in a state where substrate 101 is placed in a chamber. In this case, mask 135 used in the first etching step may be used for isotropic etching of gate connection part 108c in the second etching step and may be removed after the second etching step.

Figure 11:
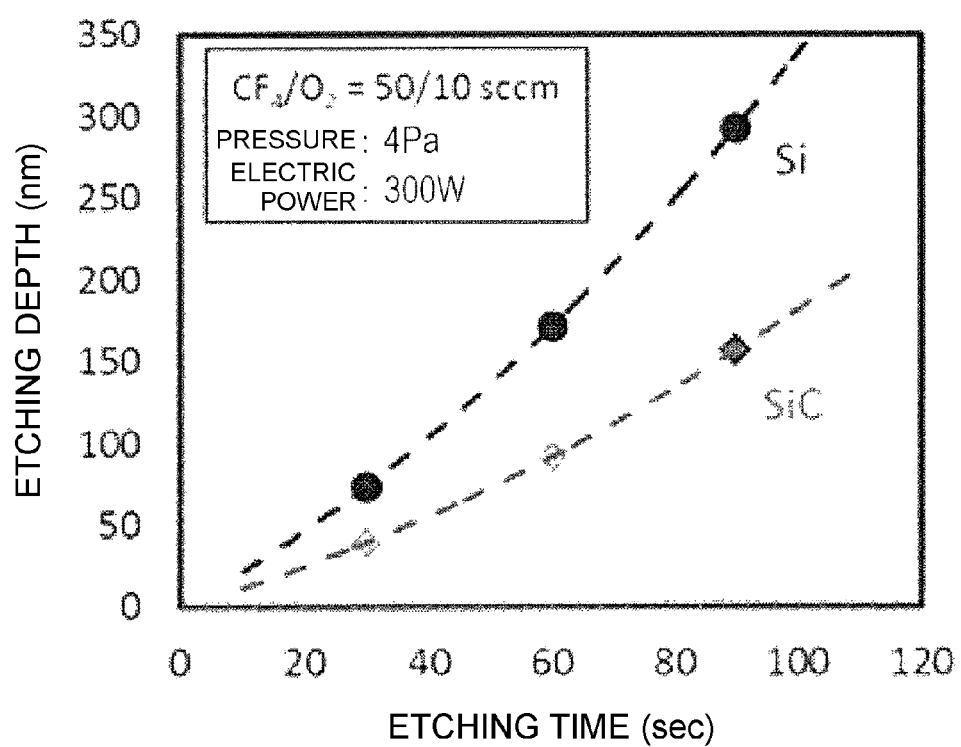
FIG. 11 is a view for comparison between an etching amount of SiC and an etching amount of polysilicon in isotropic etching.

In the second etching step, a SiC region exposed through first opening part 131 is sometimes slightly etched together with gate connection part 108c that is a polysilicon layer. FIG. 11 is a view for comparing an etching amount of polysilicon and an etching amount of SiC in a case where 50 sccm of $CF_4$ and 10 sccm of $O_2$ are used as etching gas. As is clear from FIG. 11, an etch rate of polysilicon is, for example, approximately two times as high as an etch rate of SiC. Accordingly, even in a case where silicon carbide semiconductor layer 102 is isotropically etched in first opening part 131 during isotropic etching of gate connection part 108c in the second etching step, it is considered that eaves of a size that causes step disconnection in the metal film in a step that will be described later are not formed in interlayer insulating layer 111. The "sccm" is a unit of an amount of flowing, and 1 sccm is an amount of flowing of air in a normal state (0° C. and 1 atmospheric pressure) to 1 $cm^3$ for one minute.

An etching method according to the present exemplary embodiment is not limited to the above method. For example, mask 135 may be removed after the first etching step, and isotropic etching of gate connection part 108c may be performed by using interlayer insulating layer 111 as a mask in the second etching step. The second etching step may be performed by radical etching. It is also possible to form eaves part 111a, for example, by wet etching of Si using fluonitric acid.

Figure 4G:
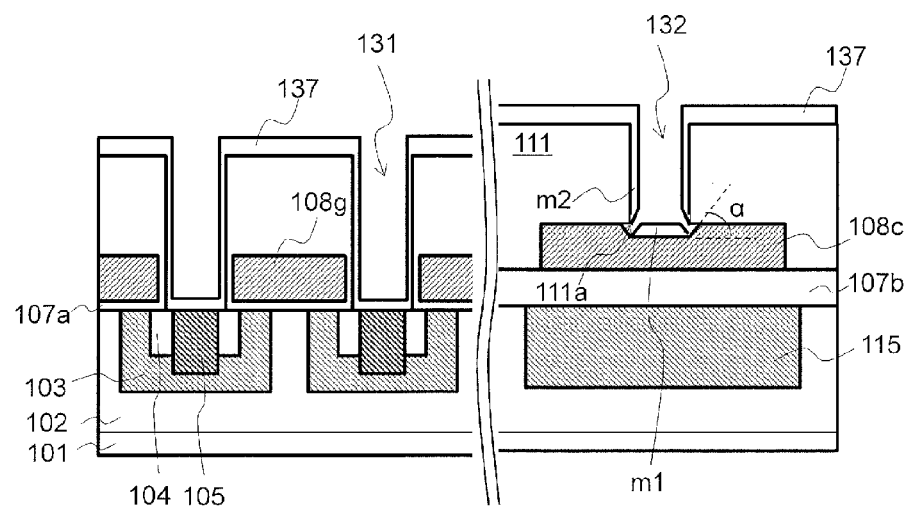
FIG. 4G is a step cross-sectional view illustrating a method for manufacturing the silicon carbide semiconductor device according to the first exemplary embodiment.

Next, as illustrated in FIG. 4G, metal film 137 is formed on interlayer insulating layer 111 and in first opening part 131 and second opening part 132. Metal film 137 can be formed, for example, by sputtering. Since the metal is not deposited on a side wall of eaves part 111a of interlayer insulating layer 111 and below eaves part 111a in this step, step disconnection of metal film 137 occurs at eaves part 111a in second opening part 132, and metal film 137 is divided into first part m1 located on a bottom surface of second opening part 132 and second part m2 located on a side wall of second opening part 132.

Metal film 137 needs just contain a metal that can form a silicide. Metal film 137 has a thickness ranging from 50 nm to 200 nm inclusive, for example. A metal film such as a Ni film or a Ti film can be used as metal film 137. Ni, which is higher in speed of reaction with Si than Ti, is more likely to cause abnormal growth of a silicide. Therefore, use of a Ni film makes an effect of suppressing abnormal growth of a silicide more remarkable. Although a method for forming metal film 137 is not limited in particular, a part of metal film 137 that is on the side wall of second opening part 132 is preferably thinner than another part of metal film 137, and bias sputtering, collimation sputtering, or the like is preferably used from this perspective.

A distance between first part m1 and second part m2 of metal film 137 changes depending on an inclination angle (taper angle) of a wall surface of second opening part 132, width y of the eaves of interlayer insulating layer 111, a thickness of metal film 137, a thickness of interlayer insulating layer 111, and the like. It is therefore possible to separate first part m1 and second part m2 sufficiently away from each other by controlling a condition of isotropic etching of gate connection part 108c, a thickness of metal film 137, and the like.

The condition of anisotropic etching is preferably set so that taper angle α of gate connection part 108c is, for example, 80 degrees or less, preferably 70 degrees or less in second opening part 132. This can cause step disconnection of metal film 137 in second opening part 132 with more certainty.

Figure 4H:
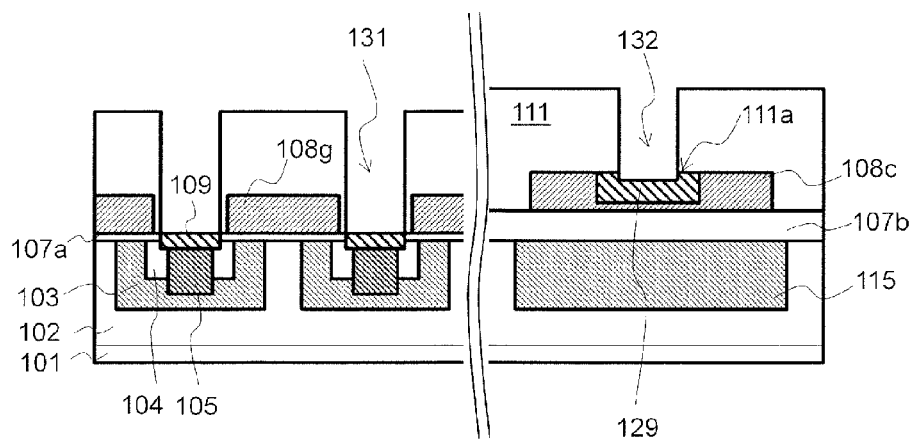
FIG. 4H is a step cross-sectional view illustrating a method for manufacturing the silicon carbide semiconductor device according to the first exemplary embodiment.

Next, as illustrated in FIG. 4H, thermal treatment is performed for 1 minute, for example, at a temperature ranging from 800° C. to 1050° C. inclusive (e.g., 950° C.) under an inert atmosphere. This causes metal film 137 (the Ni film in this example) and SiC to react with each other in first opening part 131, thereby obtaining first silicide electrode 109 made of $Ni_2Si$. In second opening part 132, first part m1 of metal film 137 (the Ni film in this example) and polysilicon react with each other, and thereby second silicide electrode 129 made of $NiSi_2$ is obtained. Second part m2, which is away from polysilicon, does not undergo silicidation reaction with polysilicon. Then, a part of metal film 137 that has not reacted with SiC nor polysilicon is removed.

In the present exemplary embodiment, metal film 137 is divided into first part m1 and second part m2 in second opening part 132, and first part m1 of metal film 137 reacts with polysilicon of gate connection part 108c. Since a Ni amount that reacts with polysilicon is thus limited, abnormal growth of a silicide is suppressed.

In a case where second silicide electrode 129 and first silicide electrode 109 are formed in a same silicidation step, second silicide electrode 129 can become thicker than first silicide electrode 109 since polysilicon is easier to react with Ni than SiC and a ratio of silicon to Ni in a Ni silicide is large. A thickness of first silicide electrode 109 is, for example, in a range from 100 nm to 400 nm inclusive, and a thickness of second silicide electrode 129 is, for example, in a range from 110 nm to 440 nm. However, in a case where a Ni amount in first part m1 of metal film 137 is small, the thickness of second silicide electrode 129 sometimes becomes equal to or smaller than the thickness of first silicide electrode 109.

Then, drain electrode 110 is formed on the second main surface opposite to the first main surface of substrate 101.

For example, drain electrode 110 made of a Ni silicide may be formed by depositing a Ni film on the whole second main surface of substrate 101 and then causing the second main surface of substrate 101 and the Ni film to react with each other through thermal treatment similar to that described above.

Next, for example, an Al film is deposited as a metal film for wiring on interlayer insulating layer 111 and in first opening part 131 and second opening part 132, and then the Al film is etched. A thickness of the Al film may be, for example, approximately 3 µm. This forms upper source electrode 112 and upper gate electrode 114. Upper source electrode 112 is electrically connected to first silicide electrode 109 in first opening part 131. Upper gate electrode 114 is electrically connected to second silicide electrode 129 in second opening part 132. In this way, source contact part SC and gate contact part GC illustrated in FIG. 3 are formed. Note that drain electrode 110 may be formed after formation of upper source electrode 112 and upper gate electrode 114.

A passivation film (not illustrated) that covers upper source electrode 112 and upper gate electrode 114 is formed. The passivation film is patterned so as to expose at least a part (also referred to as a pad region) of upper source electrode 112 and upper gate electrode 114. In this way, silicon carbide semiconductor device 201 is manufactured.

According to the above method, abnormal growth of a metal silicide that occurs when polysilicon and the first metal element react at a high temperature can be suppressed by using eaves part 111a of interlayer insulating layer 111. It is therefore possible to manufacture silicon carbide semiconductor device 201 in which a metal silicide is also disposed in gate contact part GC without complicating a manufacturing process. Furthermore, since second opening part 132 of gate contact part GC and first opening part 131 of source contact part SC can be formed in a common step, it is possible to reduce a number of manufacturing steps as compared with conventional arts. It is therefore possible to manufacture silicon carbide semiconductor device 201 that have lower resistance at lower cost.

EXAMPLES AND COMPARATIVE EXAMPLE

The inventor of the present invention formed metal silicides under different conditions of isotropic etching of a polysilicon layer and studied a relationship between a condition of isotropic etching and a shape of a metal silicide. In this example, a Ni silicide was formed as the metal silicide. Furthermore, a shape of a metal silicide obtained in a case where isotropic etching was not performed was studied for comparison. The following describes an example of a result of the study.

Examples 1 and 2

Figure 5A:
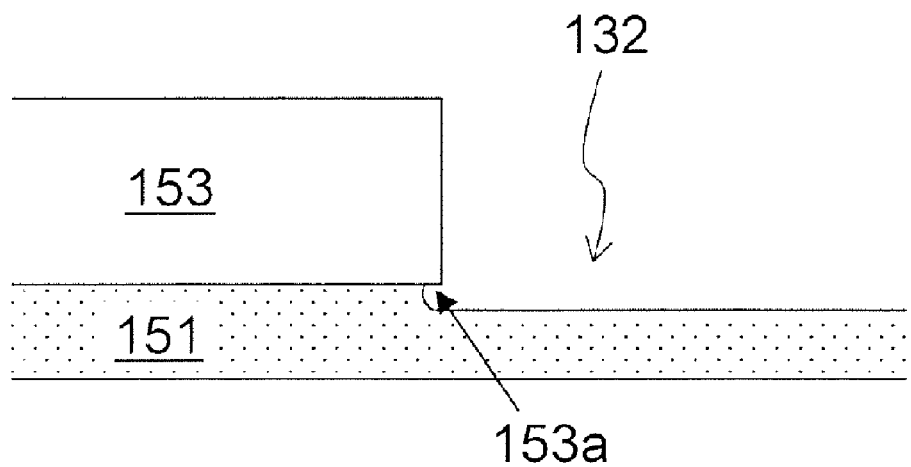
FIG. 5A is a schematic cross-sectional view for explaining a step of forming a Ni silicide according to Example 1.
Figure 5B:
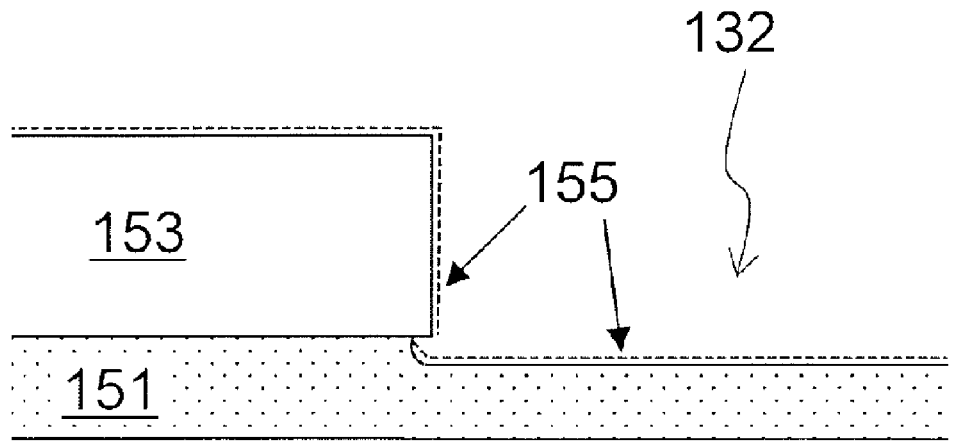
FIG. 5B is a schematic cross-sectional view for explaining a step of forming a Ni silicide according to Example 1.
Figure 5C:
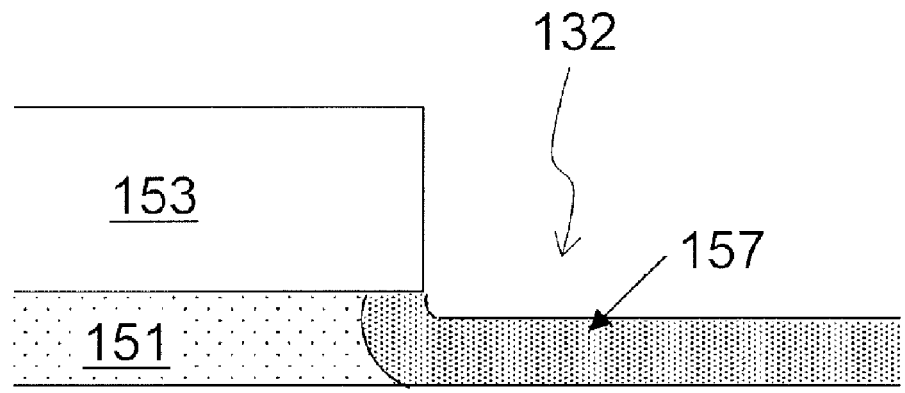
FIG. 5C is a schematic cross-sectional view for explaining a step of forming a Ni silicide according to Example 1.
Figure 6A:
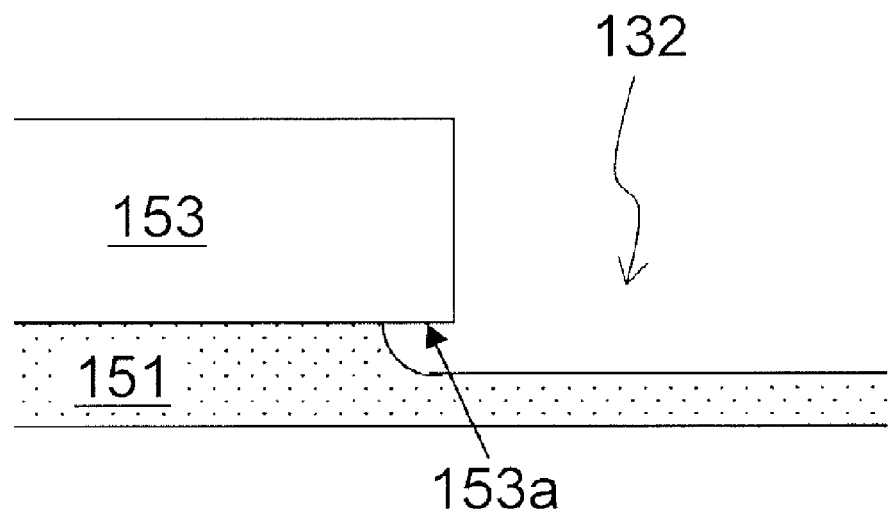
FIG. 6A is a schematic cross-sectional view for explaining a step of forming a Ni silicide according to Example 2.
Figure 6B:
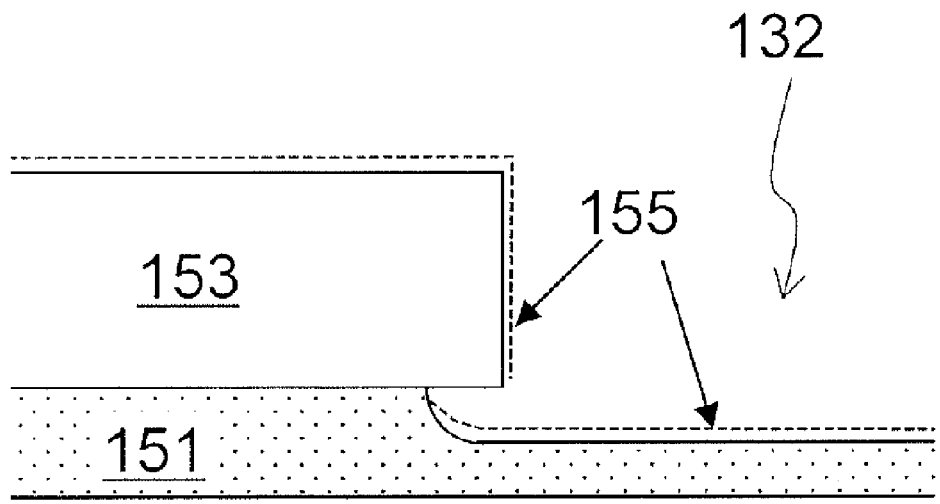
FIG. 6B is a schematic cross-sectional view for explaining a step of forming a Ni silicide according to Example 2.
Figure 6C:
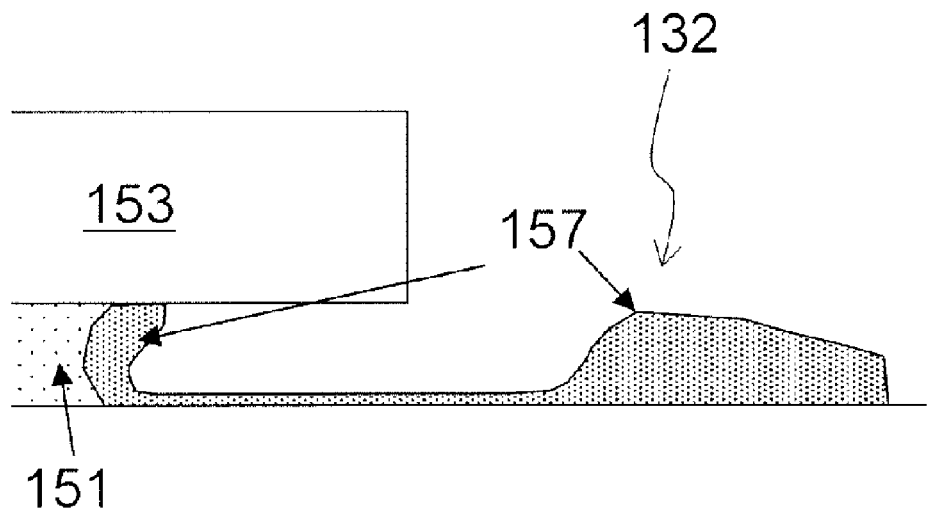
FIG. 6C is a schematic cross-sectional view for explaining a step of forming a Ni silicide according to Example 2.

FIGS. 5A through 5C are enlarged cross-sectional views schematically illustrating steps of forming a Ni silicide in Example 1, and FIGS. 6A through 6C are enlarged cross-sectional views schematically illustrating steps of forming a Ni silicide in Example 2.

In Examples 1 and 2, polysilicon layer 151 and $SiO_2$ layer 153 were formed as an electrode layer and an interlayer insulating layer, respectively, on a substrate by the above method while referring to FIG. 4D. A thickness of polysilicon layer 151 was set to 500 nm, and a thickness of $SiO_2$ layer 153 was set to 1000 nm.

Next, linear (or ring-shaped) second opening part 132 having a width of 3 µm was formed in $SiO_2$ layer 153 by anisotropic etching, and then isotropic etching was performed on polysilicon layer 151. In the isotropic etching, 50 sccm of $CF_4$ and 10 sccm of $O_2$ were used as etching gas, and an etching amount was adjusted by changing an etching period. In Example 1, an etching period of the isotropic etching was 10 seconds, and an etching amount of the isotropic etching was 100 nm. In Example 2, an etching period of the isotropic etching was 20 seconds, and an etching amount of the isotropic etching was 250 nm. A reason why a relationship between the etching amount and the etching period was not 1:1 is that a layer of a low etching rate was formed on a polysilicon surface in the anisotropic etching.

FIG. 5A schematically illustrates a cross-sectional shape of polysilicon layer 151 obtained after the isotropic etching in Example 1, and FIG. 6A schematically illustrates a cross-sectional shape of polysilicon layer 151 obtained after the isotropic etching in Example 2. In Example 2, a part of polysilicon layer 151 that was exposed through second opening part 132 was thin since the etching amount was larger than Example 1. Furthermore, in Example 2, a width of eaves part 153a of $SiO_2$ layer 153 was larger than a width of eaves part 153a in Example 1 since an etching amount of polysilicon layer 151 in a lateral direction was also large.

Figure 7A:
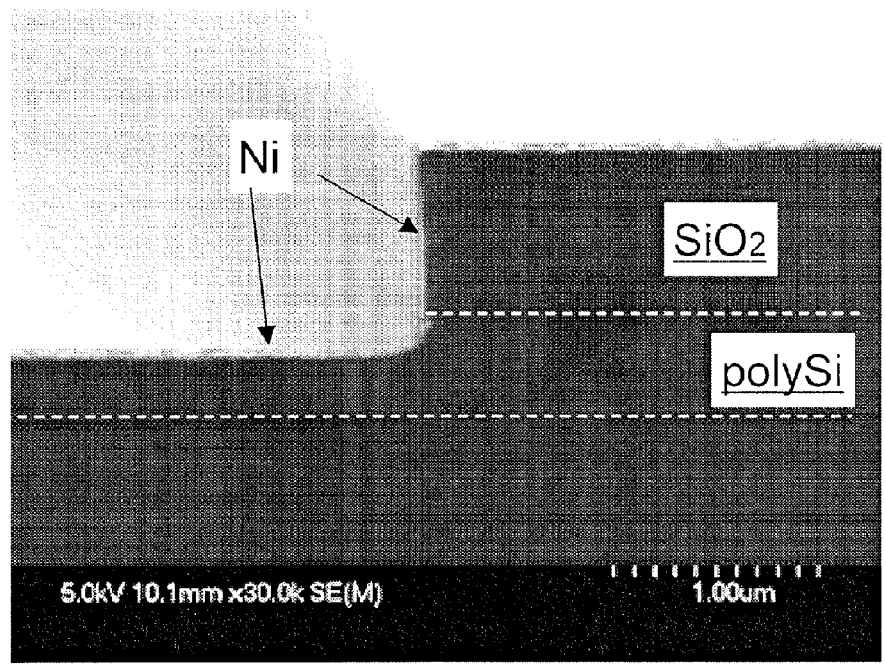
FIG. 7A is a cross-sectional SEM image showing a state where a Ni film is deposited in a second opening part in Example 1.
Figure 8A:
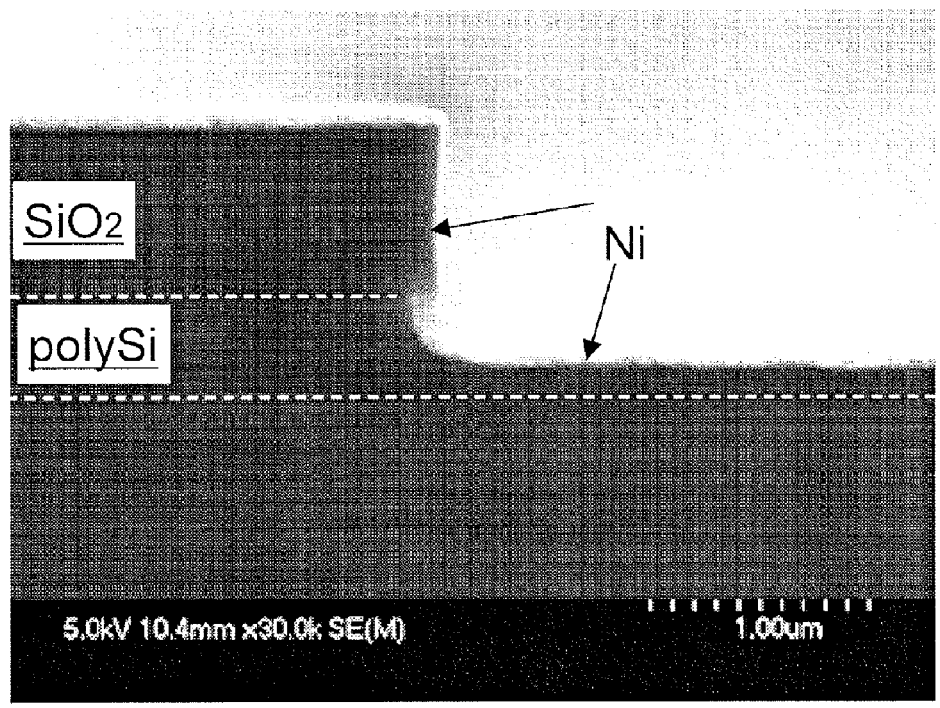
FIG. 8A is a cross-sectional SEM image showing a state where a Ni film is deposited in a second opening part in Example 2.

Then, Ni film 155 was deposited as a metal film in second opening part 132 as illustrated in FIGS. 5B and 6B. FIGS. 7A and 8A are SEM images of the cross sections illustrated in FIGS. 5B and 6B, respectively. In FIGS. 7A and 8A, boundaries between layers are indicated by broken lines for easier understanding.

In either Example, step disconnection of Ni film 155 was observed close to eaves part 153a of $SiO_2$ layer 153. Ni film 155 was divided into first part m1 located on a bottom of second opening part 132 and second part m2 located on a side wall of second opening part 132. In Example 2, a distance between first part m1 and second part m2 was larger than a distance between first part m1 and second part m2 in Example 1.

Next, Ni film 155 and polysilicon layer 151 were caused to react with each other by thermal treatment, and thus Ni silicide 157 was formed. In Examples 1 and 2, thermal treatment was performed for 1 minute at 950° C.

Figure 7B:
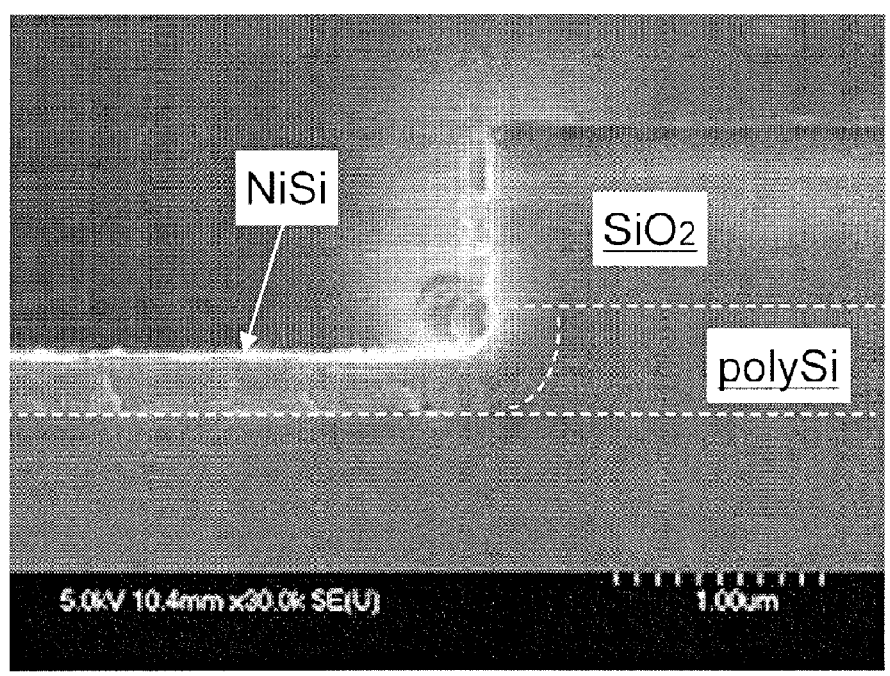
FIG. 7B is a cross-sectional SEM image showing a Ni silicide formed in Example 1.
Figure 8B:
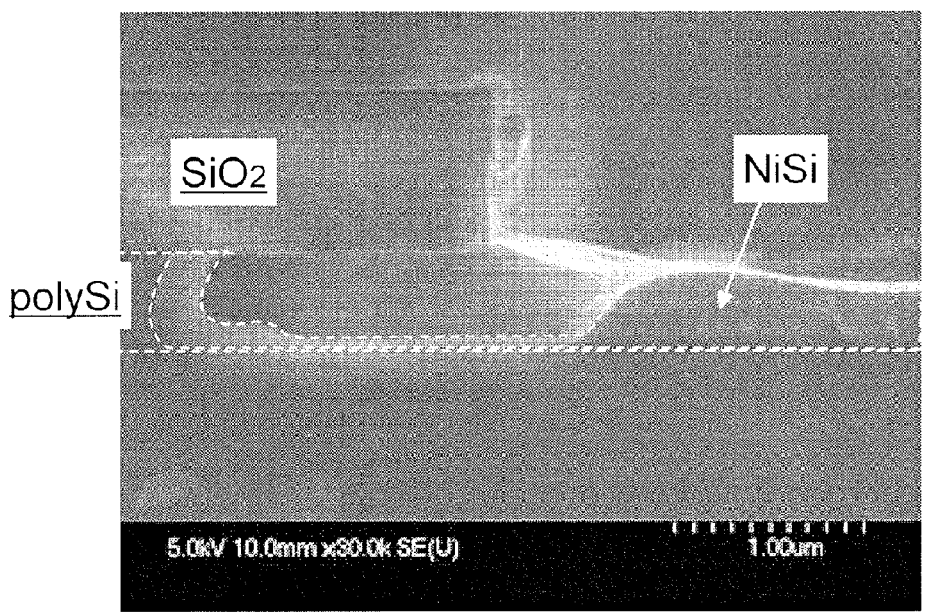
FIG. 8B is a cross-sectional SEM image showing a Ni silicide formed in Example 2.

FIG. 5C schematically illustrates a cross-sectional shape of Ni silicide 157 in Example 1, and FIG. 6C schematically illustrates a cross-sectional shape of Ni silicide 157 in Example 2. FIGS. 7B and 8B are SEM images of the cross sections of Ni silicide 157 illustrated in FIGS. 5C and 6C, respectively. In FIGS. 7B and 8B, boundaries between layers are indicated by broken lines for easier understanding.

In Examples 1 and 2, abnormal growth of Ni silicide 157 was not observed. Furthermore, Ni silicide 157 was also formed below $SiO_2$ layer 153 in a part surrounding second opening part 132. Although Ni silicide 157 was formed on the bottom of second opening part 132 so as to have a substantially uniform thickness in Example 1, a thickness of Ni silicide 157 was uneven in Example 2. This is considered to be because a polysilicon amount relative to a Ni amount in Example 2 was smaller than a polysilicon amount relative to a Ni amount in Example 1 and therefore Ni invaded more into a part of polysilicon layer 151 that was located below $SiO_2$ layer 153.

This revealed that a shape, a thickness, and the like of Ni silicide 157 can be controlled by changing, for example, a condition of isotropic etching.

Although linear second opening part 132 was formed in $SiO_2$ layer 153 in Examples 1 and 2, similar tendency was observed even in a case where rectangular second opening part 132 was formed.

In Examples 1 and 2, Ni silicide 157 was formed throughout the entire thickness of polysilicon layer 151. It is also possible to form Ni silicide 157 only in a superficial part of polysilicon layer 151 and to leave polysilicon of a predetermined thickness below Ni silicide 157 by adjusting thicknesses, a thermal treatment condition, and the like of polysilicon layer 151 and Ni film 155. This makes it possible to suppress intrusion of Ni into insulating layer 107, further increasing reliability of insulating layer 107.

Comparative Example

Figure 9A:
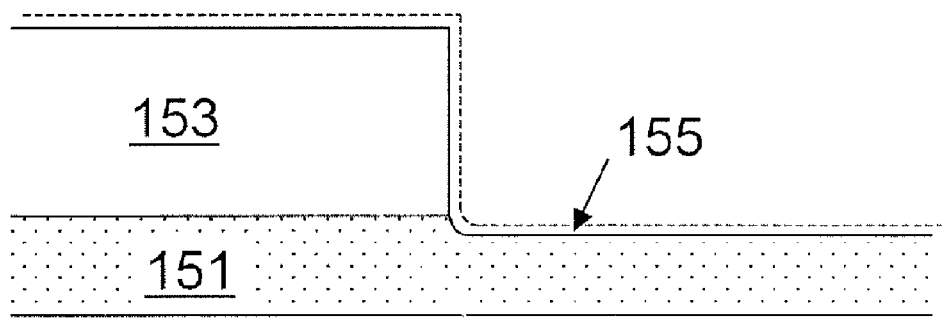
FIG. 9A is a schematic cross-sectional view for explaining a step of forming a Ni silicide according to a comparative example.
Figure 9B:
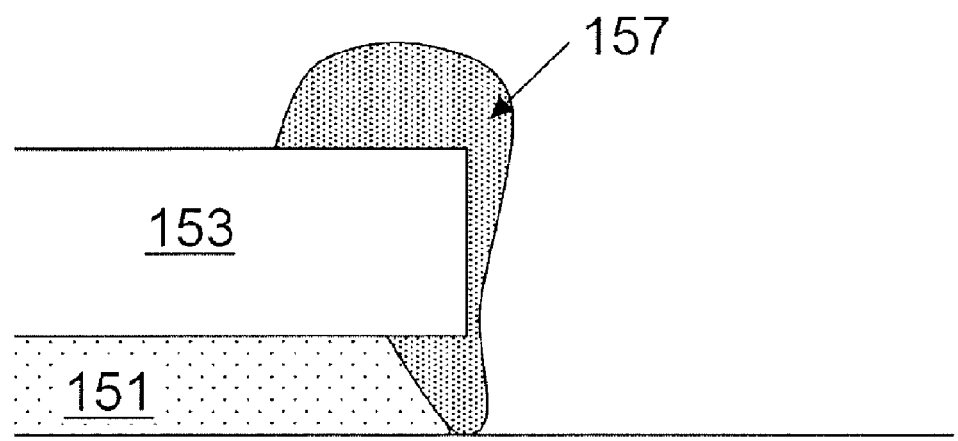
FIG. 9B is a schematic cross-sectional view for explaining a step of forming a Ni silicide according to a comparative example.

FIGS. 9A and 9B are enlarged cross-sectional views for explaining a method for forming a Ni silicide according to a comparative example.

In the comparative example, rectangular second opening part 132 was formed in $SiO_2$ layer 153 by anisotropic etching, and then Ni film 155 was formed without performing isotropic etching of polysilicon layer 151. As illustrated in FIG. 9A, in the comparative example, step disconnection of Ni film 155 did not occur when Ni film 155 was deposited in second opening part 132.

Then, Ni silicide 157 was formed by performing thermal treatment under similar conditions to the conditions in Examples 1 and 2.

Figure 10:
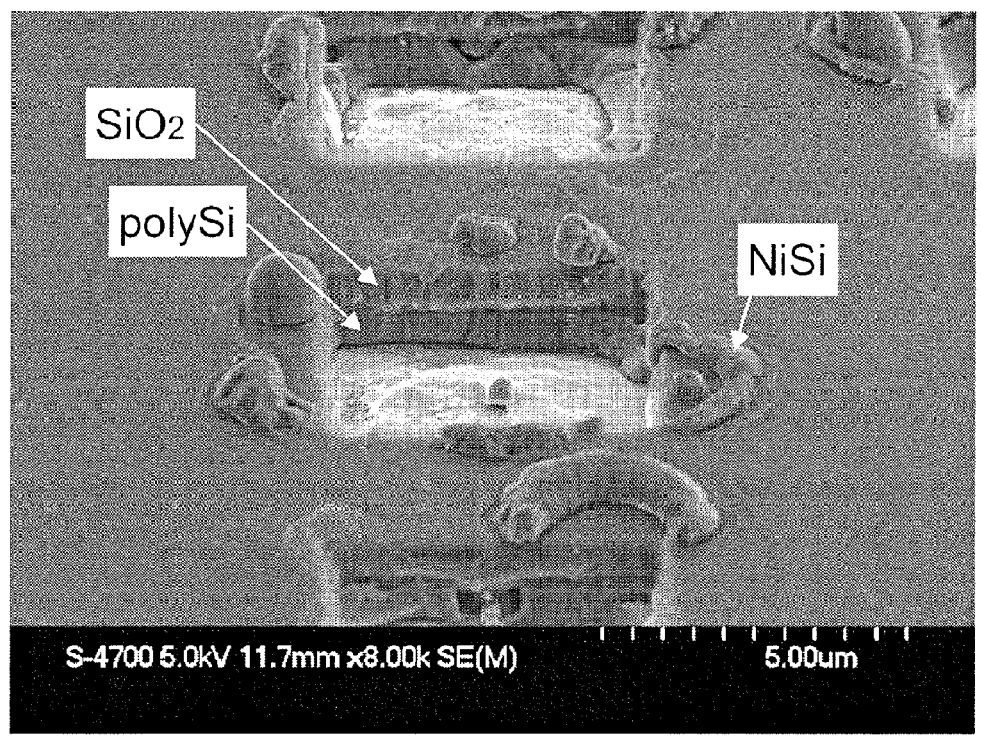
FIG. 10 is a surface SEM image showing a Ni silicide formed in the comparative example.

FIG. 9B is a cross-sectional view schematically illustrating a shape of Ni silicide 157 in the comparative example, and FIG. 10 is a surface SEM image of Ni silicide 157 according to the comparative example. As illustrated in FIGS. 9B and 10, in the comparative example, Ni silicide 157 was also formed on $SiO_2$ layer 153, and abnormal growth of Ni silicide 157 was observed. No polysilicon remained in second opening part 132. Furthermore, an insulating layer that is a base of polysilicon layer 151 was exposed in second opening part 132. A reason why these phenomena occurred is inferred as follows.

Since polysilicon in second opening part 132 can react with Ni on a side wall and a top surface of $SiO_2$ layer 153, a Ni amount is excessive relative to a polysilicon amount. Furthermore, a phenomenon that Si atoms move to a Ni layer during Ni silicide reaction is known. Accordingly, Si atoms in polysilicon are sucked up by the Ni layer on the side wall and the top surface of $SiO_2$ layer 153. It is considered that as a result, polysilicon in second opening part 132 entirely moved to the Ni layer on the side wall and the top surface of $SiO_2$ layer 153 and formed Ni silicide 157.

The result of the studies reveals that abnormal growth of Ni silicide 157 can be suppressed by adjusting a Ni amount that can react with polysilicon layer 151 by intentionally causing step disconnection of Ni film 155. This makes it possible to also dispose a Ni silicide in gate contact part GC, thereby making it possible to form source contact part SC and gate contact part GC in a common step.

A silicon carbide semiconductor device according to the present exemplary embodiment is not limited to a planar-structured vertical MISFET, but may be a trench-structured vertical MISFET. Alternatively, a silicon carbide semiconductor device according to the present exemplary embodiment may be an insulated gate bipolar transistor (IGBT) using a silicon carbide substrate having a conductivity type that differs from a conductivity type of a silicon carbide semiconductor layer.

The silicon carbide semiconductor device according to the present disclosure is widely applicable to semiconductor devices for various purposes and various drive devices provided with the same, such as inverter circuits. For example, the silicon carbide semiconductor device is well applicable to semiconductor devices to be mounted on vehicles or for industrial devices.

What is claimed is:

1. A silicon carbide semiconductor device comprising:
a substrate having a first main surface;
a silicon carbide semiconductor layer disposed on the first main surface of the substrate;
an electrode layer containing polysilicon and disposed above the silicon carbide semiconductor layer with a first insulating layer interposed between the electrode layer and the silicon carbide semiconductor layer;
a second insulating layer that covers the silicon carbide semiconductor layer and the electrode layer;
a first silicide electrode that is located in a first opening part formed in the first insulating layer and the second insulating layer and forms ohmic contact with a part of the silicon carbide semiconductor layer; and
a second silicide electrode that is located in a second opening part formed in the second insulating layer and is in contact with a part of the electrode layer,
wherein
the first silicide electrode and the second silicide electrode each contains a silicide of a first metal element, and
an end of the second silicide electrode is located below the second insulating layer in a peripheral part of the second opening part, and a width of the second silicide electrode is larger than a width of a bottom surface of the second opening part in a cross section perpendicular to the first main surface of the substrate.

2. The silicon carbide semiconductor device according to claim 1, wherein the second silicide electrode covers the entire bottom surface of the second opening part.

3. The silicon carbide semiconductor device according to claim 1, wherein the second silicide electrode is disposed only in the second opening part and in the peripheral part of the second opening part.

4. The silicon carbide semiconductor device according to claim 1, wherein a lower surface of the second silicide electrode is in contact with the electrode layer.

5. The silicon carbide semiconductor device according to claim 1, wherein a thickness of a part of the electrode layer that is located between the second silicide electrode and the first insulating layer is equal to or larger than ⅓ of a thickness of another part of the electrode layer and less than the thickness of the other part of the electrode layer.

6. The silicon carbide semiconductor device according to claim 1, wherein at least a part of a lower surface of the second silicide electrode is in contact with the first insulating layer.

7. The silicon carbide semiconductor device according to claim 1, wherein the second silicide electrode is thicker than the first silicide electrode.

8. The silicon carbide semiconductor device according to claim 1, wherein a first metal element is nickel (Ni) or titanium (Ti).

9. The silicon carbide semiconductor device according to claim 1, further comprising:
a first upper electrode that is disposed on the second insulating layer and in the first opening part and is in contact with the first silicide electrode in the first opening part; and
a second upper electrode that is disposed on the second insulating layer and in the second opening part and is in contact with the second silicide electrode in the second opening part.

10. The silicon carbide semiconductor device according to claim 9, wherein
the substrate has a cell region where the first upper electrode is disposed and that includes a plurality of unit cells and a wiring region where the second upper electrode is disposed;
each of the plurality of unit cells includes:
a body region of a second conductivity type that is selectively formed in a surface of the silicon carbide semiconductor layer,
a source region of a first conductivity type that is selectively formed in the body region, and
a gate electrode disposed on the silicon carbide semiconductor layer with the first insulating layer interposed between the gate electrode and the silicon carbide semiconductor layer;
the electrode layer includes a gate part that is located in the cell region and includes the gate electrode of each of the plurality of unit cells and a gate connection part that is located in the wiring region and is connected to the gate part;
the first opening part is disposed in each of the plurality of unit cells, and in the first opening part, the first silicide electrode is electrically connected to the source region and the body region provided in the silicon carbide semiconductor layer; and
the second opening part is disposed in the wiring region, and the second silicide electrode is in contact with the gate connection part of the electrode layer in the second opening part.

11. The silicon carbide semiconductor device according to claim 10, wherein a part of the first insulating layer that is located below the second silicide electrode is thicker than a part of the first insulating layer that is located below the gate part of the electrode layer.

12. The silicon carbide semiconductor device according to claim 10, further comprising, below the second silicide electrode, another body region of a second conductivity type that is selectively disposed in the surface of the silicon carbide semiconductor layer.

13. A method for manufacturing a silicon carbide semiconductor device, the method comprising:
a step of preparing a substrate on which a silicon carbide semiconductor layer is formed;
a step of forming an electrode layer by forming a polysilicon film on the silicon carbide semiconductor layer with a first insulating layer interposed between the electrode layer and the silicon carbide semiconductor layer and then patterning the polysilicon film;
a step of forming a second insulating layer that covers the first insulating layer and the electrode layer;
a first etching step of forming, in the second insulating layer and the first insulating layer, a first opening part through which a part of the silicon carbide semiconductor layer is exposed and forming, in the second insulating layer, a second opening part through which a part of the electrode layer is exposed;
a second etching step of forming an eaves part in the second insulating layer by removing a part of the electrode layer that is located below the second insulating layer in a peripheral part of the second opening part;

a metal film forming step of forming a metal film containing a first metal element on the second insulating layer and in the first opening part and the second opening part, wherein in the second opening part, the metal film is divided into a first part located on a bottom surface of the second opening part and a second part located on a side wall of the second opening part by the eaves part of the second insulating layer; and a silicidation step of forming a first silicide electrode containing a silicide of the first metal element by causing the metal film and the silicon carbide semiconductor layer to react with each other in the first opening part through thermal treatment of the substrate and forming a second silicide electrode containing a silicide of the first metal element by causing the first part of the metal film and the electrode layer to react with each other in the second opening part.

14. The method according to claim 13, wherein
the first etching step is a step of forming the first opening part and the second opening part by performing anisotropic etching of the second insulating layer and the first insulating layer by using a mask disposed on the second insulating layer; and the second etching step includes a step of performing isotropic etching of the part of the electrode layer that is exposed in the second opening part.

15. The method according to claim 14, wherein the mask is removed after the second etching step.

16. The method according to claim 14, wherein the mask is removed between the first etching step and the second etching step.

17. The method according to claim 13, wherein
dry etching using first etching gas is performed in the first etching step;
dry etching using second etching gas different from the first etching gas is performed in the second etching step; and
the first etching step and the second etching step are successively performed by switching etching gas in a chamber.

18. The method according to claim 13, wherein the thermal treatment in the silicidation step is performed at a temperature ranging from 800° C. to 1050° C. inclusive.

19. The method according to claim 13, wherein the first metal element is Ni or Ti.

* * * * *